(12) United States Patent
Kim et al.

(10) Patent No.: US 7,947,530 B2
(45) Date of Patent: May 24, 2011

(54) METHOD OF MANUFACTURING WAFER LEVEL PACKAGE INCLUDING COATING AND REMOVING RESIN OVER THE DICING LINES

(75) Inventors: Jin Gu Kim, Suwon-si (KR); Young Do Kweon, Seoul (KR); Hyung Jin Jeon, Gunpo-si (KR); Seung Wook Park, Seoul (KR); Hee Kon Lee, Hwaseong-si (KR); Seon Hee Moon, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 156 days.

(21) Appl. No.: 12/453,273

(22) Filed: May 5, 2009

(65) Prior Publication Data
US 2010/0159646 A1    Jun. 24, 2010

(30) Foreign Application Priority Data
Dec. 19, 2008 (KR) .................. 10-2008-0130219

(51) Int. Cl.
*H01L 21/44* (2006.01)
*H01L 21/48* (2006.01)
*H01L 21/50* (2006.01)
(52) U.S. Cl. .................. 438/112; 438/113; 438/114

(58) Field of Classification Search .................. 438/112, 438/113, 114, E21.599
See application file for complete search history.

(56) References Cited

FOREIGN PATENT DOCUMENTS

| JP | 2000021823 | * | 1/2000 |
|---|---|---|---|
| KR | 100225324 | | 7/1999 |
| KR | 1020020012060 | | 2/2002 |

* cited by examiner

*Primary Examiner* — William M. Brewster

(57) ABSTRACT

The present invention relates to a method of manufacturing a wafer level package including the steps of: preparing a substrate wafer including a plurality of pads formed on a bottom surface, a plurality of chips positioned on a top surface, and dicing lines for dividing the chips; forming external connection units on the pads; coating resin on the dicing lines by positioning masks on the substrate wafer to expose only the dicing lines; removing the masks; encapsulating the chips positioned between the resin by coating the chips with encapsulant; removing the resin coated on the dicing lines; and cutting a wafer level package along the dicing lines exposed by removing the resin into units.

6 Claims, 3 Drawing Sheets

[FIG. 1]
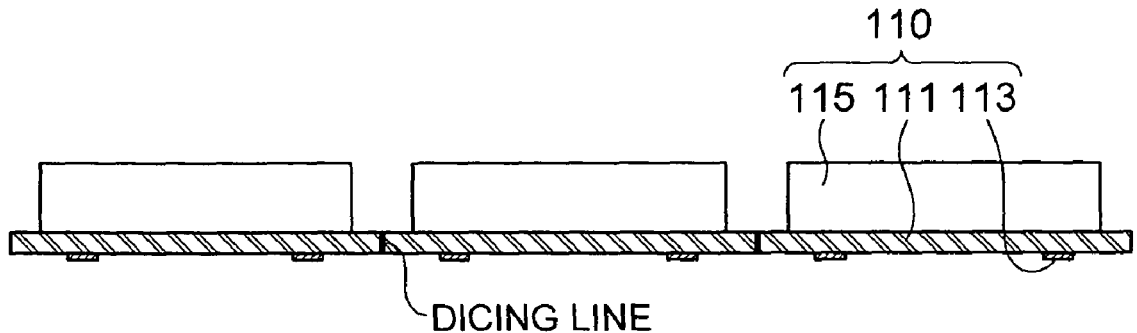
[FIG. 2]
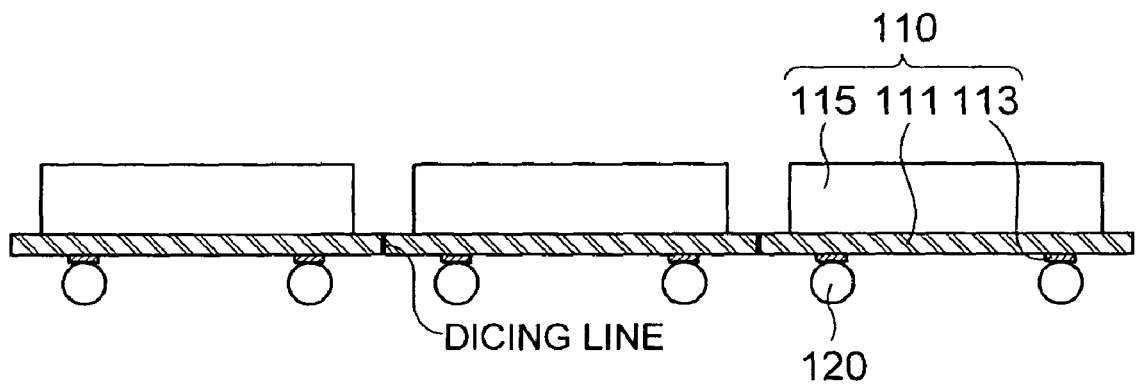
[FIG. 3]
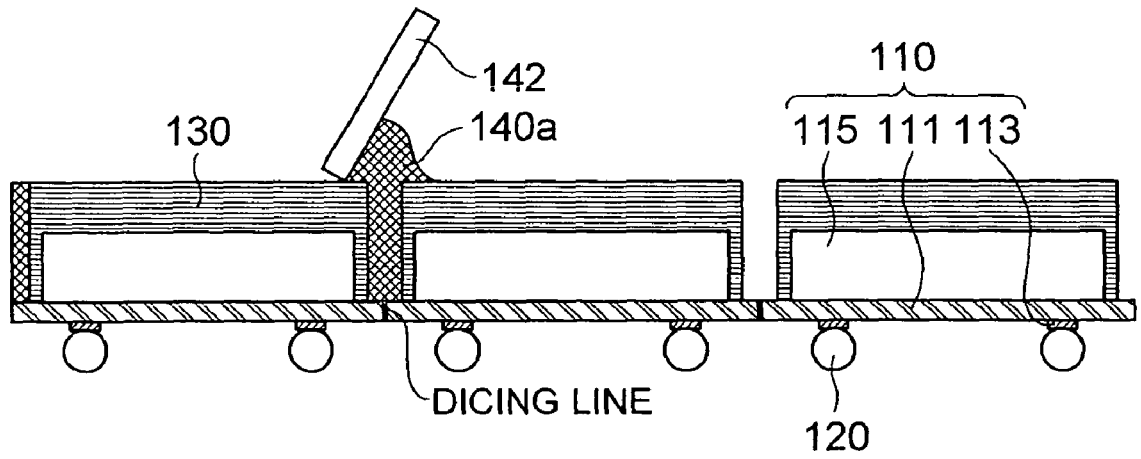

[FIG. 4]
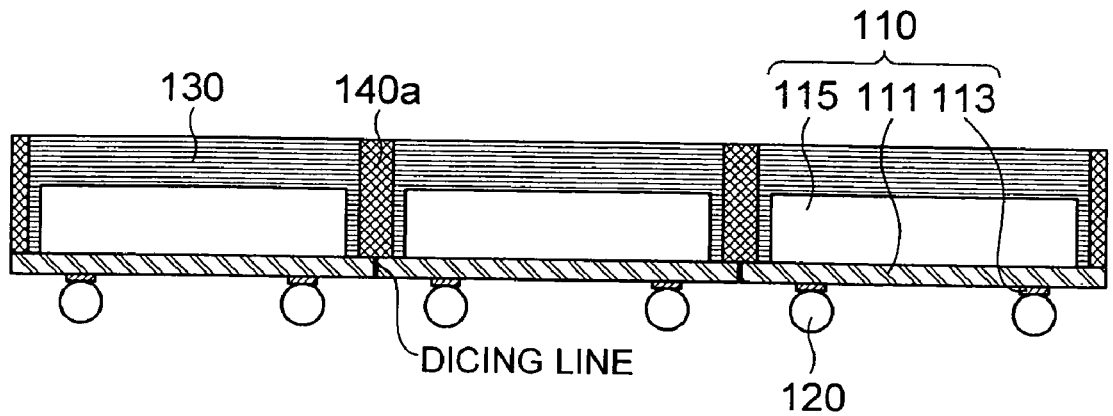
[FIG. 5]
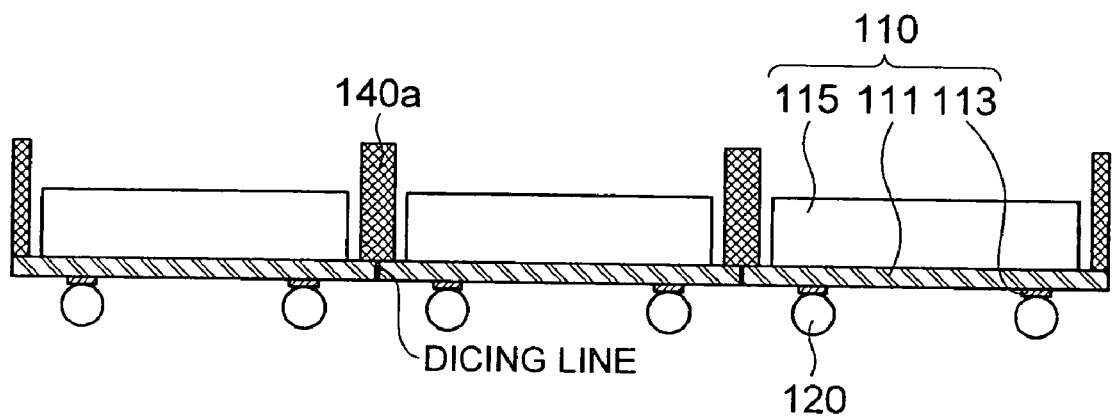
[FIG. 6]
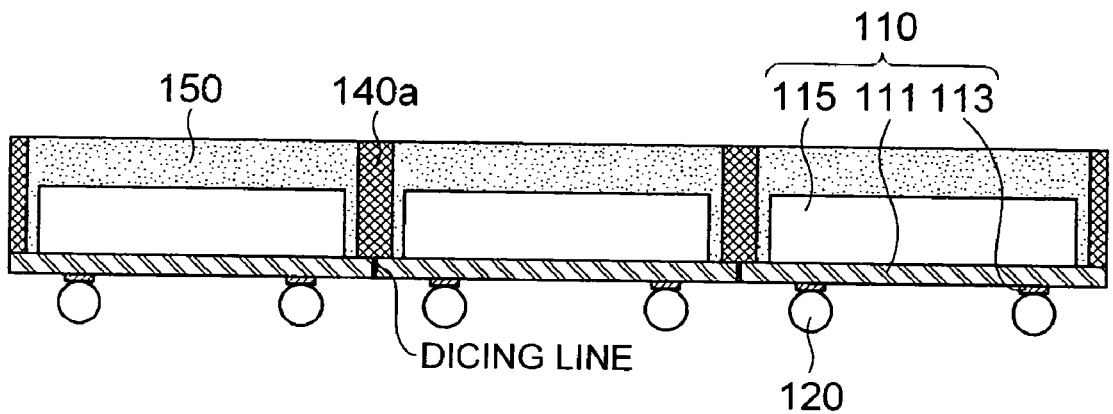

[FIG. 7]
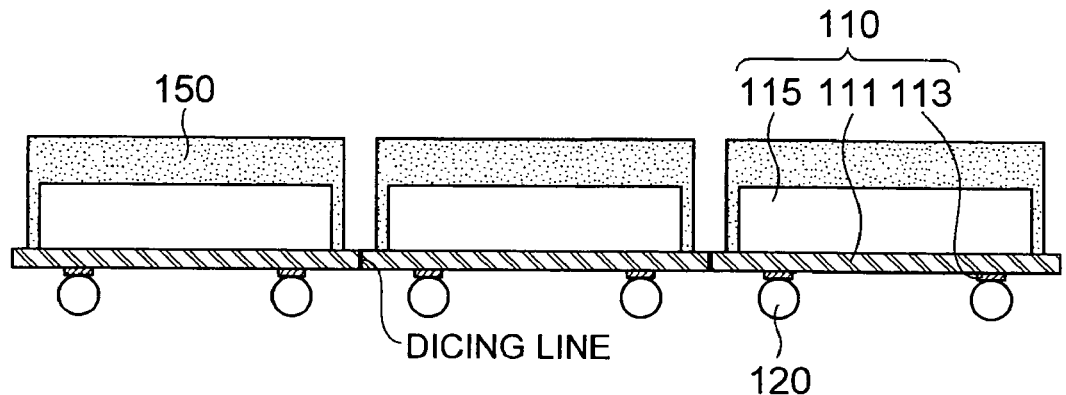
[FIG. 8]
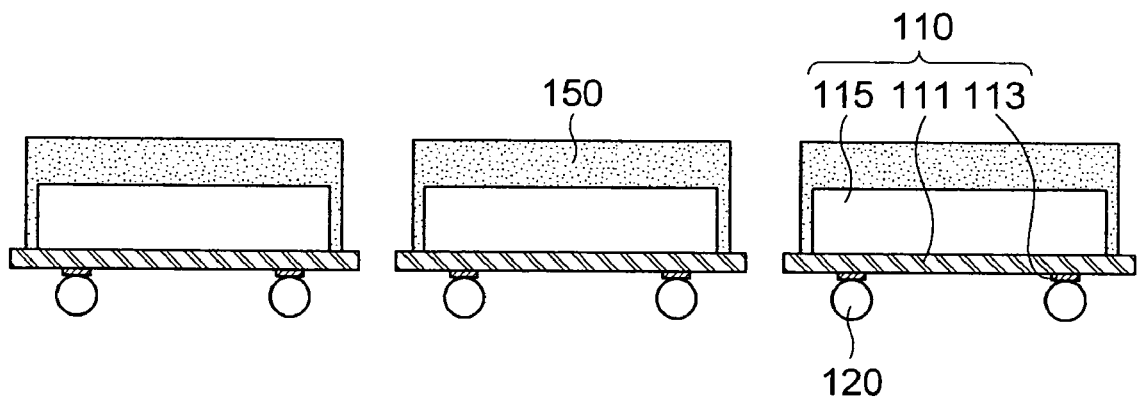
[FIG. 9]
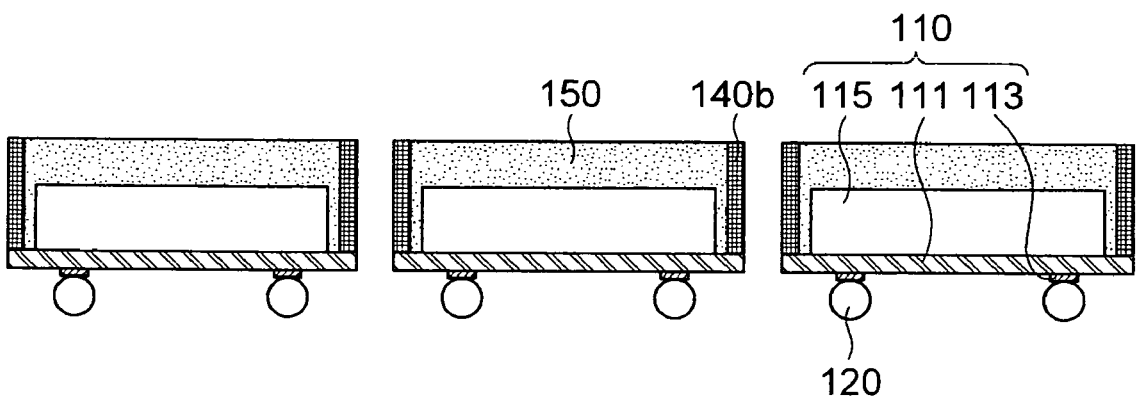

METHOD OF MANUFACTURING WAFER LEVEL PACKAGE INCLUDING COATING AND REMOVING RESIN OVER THE DICING LINES

CROSS-REFERENCE TO RELATED APPLICATIONS

This application claims the benefit of Korean Patent Application No. 10-2008-0130219 filed with the Korea Intellectual Property Office on Dec. 19, 2008, the disclosure of which is incorporated herein by reference.

BACKGROUND OF THE INVENTION

1. Field of the Invention

The present invention relates to a method of manufacturing a wafer level package; and, more particularly, to a method of manufacturing a wafer level package to coat resin on a dicing line formed on a substrate wafer.

2. Description of the Related Art

A conventional package is manufactured by cutting a wafer having a plurality of chips along dicing lines to be divided into individual chips and then performing a packaging process for each of the individual chips.

However, because the packaging process includes a lot of unit processes, e.g., chip attaching, wire bonding, molding, trimming/forming or the like, a conventional method of manufacturing the package to perform the packaging process by each of the chips has a disadvantage of needing a very long time for packaging all of the chips when considering the number of the chips obtained from one wafer.

Therefore, recently, there has been suggested a wafer level package method of manufacturing an individual package by firstly performing the packaging process in a wafer level and then cutting a wafer level package along dicing lines of a wafer.

In the wafer level package, it is general that after a molding process is performed on the wafer provided with a chip or the like by using molding resin such as EMC(Epoxy Mold Compound), the surface of the molding resin is formed to be flat. However, if the molding resin has the flat surface, the CTE (Coefficient of Thermal Expansion) of the molding resin is more than double to ten times the CTE of the wafer and so the molding resin may be considerably contracted due to heat generated in the molding process, which causes a warpage phenomenon where the wafer is rolled and makes the dicing lines unseen.

SUMMARY OF THE INVENTION

The present invention has been invented in order to overcome the above-described problems and it is, therefore, an object of the present invention to provide a method of manufacturing a wafer level package capable of preventing a warpage phenomenon where a wafer is rolled in an encapsulation process by coating resin on dicing lines formed on a substrate wafer and of smoothly performing dicing work by cutting a wafer level package along dicing lines exposed by removing the resin.

In accordance with one aspect of the present invention to achieve the object, there is provided a method of manufacturing a wafer level package including the steps of: preparing a substrate wafer including a plurality of pads formed on a bottom surface, a plurality of chips positioned on a top surface, and dicing lines for dividing the chips; forming external connection units on the pads; coating resin on the dicing lines by positioning masks on the substrate wafer to expose only the dicing lines; removing the masks; encapsulating the chips positioned between the resin by coating the chips with encapsulant; removing the resin coated on the dicing lines; and cutting a wafer level package along the dicing lines exposed by removing the resin into units.

Further, the resin can be formed of any one of transparent, translucent, or opaque photocurable, thermosetting, and thermoplastic resin in the step of coating the resin on the dicing lines.

Further, the method further includes a step of: curing the resin after the step of coating the resin on the dicing lines.

Further, the encapsulant can be formed of liquid resin or solid epoxy mold compound in the step of encapsulating the chips on the substrate with the encapsulant.

Further, the encapsulant can be coated by any one of printing, dispensing, dipping, spin coating, compression molding, and transfer molding in the step of encapsulating the chips on the substrate with the encapsulant.

Further, the resin can be removed by a wet method or a plasma method in the step of removing the resin coated on the dicing lines.

In accordance with another aspect of the present invention to achieve the object, there is provided a method of manufacturing a wafer level package including the steps of: preparing a substrate wafer including a plurality of pads formed on a bottom surface, a plurality of chips positioned on a top surface, and dicing lines for dividing the chips; forming external connection units on the pads; coating resin on the dicing lines by positioning masks on the substrate wafer to expose only the dicing lines; removing the masks; encapsulating the chips positioned between the resin by coating the chips with encapsulant; and cutting a wafer level package along the dicing lines coated with the resin into units.

Further, the resin can be formed of any one of transparent photocurable, thermosetting, and thermoplastic resin in the step of coating the resin on the dicing lines.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1 to 8 are cross-sectional views sequentially illustrating a method of manufacturing a wafer level package in accordance with an embodiment of the present invention; and FIG. 9 is a cross-sectional view illustrating a method of manufacturing a wafer level package in accordance with another embodiment of the present invention.

DETAILED DESCRIPTION OF THE PREFERABLE EMBODIMENTS

Hereinafter, a matter regarding to an operation effect including a technical configuration for a method of manufacturing a wafer level package in accordance with the present invention will be appreciated clearly through the following detailed description with reference to the accompanying drawings illustrating preferable embodiments of the present invention.

Methods of manufacturing wafer level packages in accordance with embodiments of the present invention will be described in detail with reference to FIGS. 1 to 9.

FIGS. 1 to 8 are cross-sectional views sequentially illustrating a method of manufacturing a wafer level package in accordance with an embodiment of the present invention and FIG. 9 is a cross-sectional view illustrating a method of manufacturing a wafer level package in accordance with another embodiment of the present invention.

At first, as shown in FIG. 1, there is prepared a substrate wafer 110 including a plurality of pads 113 formed on a bottom surface, a plurality of chips 115 positioned on a top surface, and dicing lines for dividing the chips 115.

At this time, the dicing lines are formed at equal intervals in a row direction and a column direction in which the chips 115 are positioned and can be processed by any one of a sanding process where the surface of the substrate wafer 110 is slightly cut or carved, an etching process as a surface processing method applying erosive action of chemical agents or an ultrasound process as another surface processing method using ultrasound vibration.

And, inside the substrate wafer 110, there can be further formed via holes(not shown in the drawings) for electrical connection between the chips 115 and external connection units 120 to be formed on the pads 113 later.

Herein, material of the substrate wafer 110 as a substrate used in a semiconductor process can be silicon, ceramic, glass, polymer, and so on.

Then, as illustrated in FIG. 2, the external connection units 120 are formed on the pads 113 of the substrate wafer 110. The external connection units 120 can be solder balls which are electrically connected through the medium of the pads 113. At this time, the external connection units 120 can be formed of solder bumps with another shape other than the solder balls.

Then, as shown in FIG. 3, resin 140a is coated on the dicing lines after positioning masks 130 on the substrate wafer 110 to expose only the dicing lines. At this time, the resin 140a coated on the surfaces of the masks 130 is pushed in the dicing lines with a squeeze 142 to be uniformly coated. And, any one of a mask patterned by photoresist or a screen printing mask can be used as the mask. Further, it is preferable that the resin 140a and 140b is formed of any one of transparent, translucent, or opaque photocurable, thermosetting, and thermoplastic resin.

Then, as illustrated in FIGS. 4 and 5, after curing the resin 140a for a predetermined time, the masks 130 are removed. At this time, the resin 140a is cured by irradiating ultraviolet rays through a UV curing system or applying heat at more than a predetermined temperature. Therefore, the resin 140a is firmly fixed between the chips 115 positioned on the substrate wafer 110, i.e., on the dicing lines for dividing the chips 115.

Then, as shown in FIG. 6, the chips 115 positioned between the resin 140a are encapsulated by being coated with encapsulant 150 in order to finish a wafer level package. The encapsulant 150 can be made of liquid resin, solid epoxy mold compound, or the like and the encapsulant can be coated by any one of printing, dispensing, dipping, spin coating, compression molding, and transfer molding.

At this time, the resin 140a formed on the dicing lines for dividing the chips 115 narrows a region where stress generated due to a CTE(Coefficient of Thermal Expansion) difference between the encapsulant 150 and the substrate wafer 110 is transmitted in order to reduce the stress so that power contracting the substrate wafer 110 in an encapsulation process can be distributed. Therefore, it is possible to improve a warpage phenomenon of the substrate wafer 110.

Then, as shown in FIG. 7, the resin 140a is removed. At this time, the resin 140a can be removed by a wet method using chemical agents such as permanganate or a plasma method using plasma as an aggregate of particles consisting of ion-nuclei and free electrons, which is formed by continuing to apply heat to material of a gaseous state in order to increase a temperature.

However, in case that the resin 140b is coated on the dicing lines by using any one of the transparent photocurable, thermosetting, and thermoplastic resin in a step of coating the resin on the dicing lines, dicing work can be performed along the dicing lines coated with the resins 140 without removing the resin 140b as shown in FIG. 9. In this case, a process before the step of coating the resin 140b on the dicing lines is performed similarly, while a step of removing the resins 140b is omitted, thereby enhancing workability and productivity.

Then, a s shown in FIG. 8, the wafer level package is cut along the dicing lines exposed by removing the resins 140a into units. Accordingly, dicing work can be smoothly accomplished by cutting it along the exposed dicing lines.

And, the dicing work of the wafer level package is performed with a dicing blade(not shown in the drawings), wherein the dicing blade is a semiconductor wafer processing device capable of exactly cutting a subject at a high speed without attaching shavings to a cutting surface. As described above, if the wafer level package is diced along the exposed dicing lines, a region to be diced by the dicing blade is reduced in order to reduce pressure applied to the dicing blade, thereby increasing durability and wear resistance of the dicing blade.

As described above, the method of manufacturing the wafer level package in accordance with the present invention can narrow the region where the stress generated due to the CTE difference between the encapsulant 150 and the substrate wafer 110 is transmitted in the encapsulation process in order to reduce the stress by coating the resin 140a and 140b on the dicing lines formed on the substrate wafer 110, so that the power by which the substrate wafer 110 is contracted can be distributed in order to improve the warpage phenomenon of the substrate wafer 110.

Further, thereafter, in case that the resin 140a is removed, the dicing work can be smoothly accomplished by cutting it along the exposed dicing lines, thereby remarkably enhancing quality and yield of the wafer level package. Consequently, the workability and the productivity of the wafer level package can be enhanced.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A method of manufacturing a wafer level package comprising:

preparing a substrate wafer including a plurality of pads formed on a bottom surface, a plurality of chips positioned on a top surface and dicing lines for dividing the chips;

forming external connection units on the pads;

coating resin on the dicing lines by positioning masks on the substrate wafer to expose only the dicing lines;

removing the masks;

encapsulating the chips positioned between the resin by coating the chips with encapsulant;

removing the resin coated on the dicing lines; and cutting a wafer level package along the dicing lines exposed by removing the resin into units.

2. The method of claim 1, wherein the resin is formed of any one of transparent, translucent, or opaque photocurable, thermosetting, and thermoplastic resin in the coating the resin on the dicing lines.

3. The method of claim 1, further comprising: curing the resin after the coating the resin on the dicing lines.

4. The method of claim 1, wherein the encapsulant is formed of liquid resin or solid epoxy mold compound in the encapsulating the chips on the substrate with the encapsulant.

5. The method of claim 1, wherein the encapsulant is coated by any one of printing, dispensing, dipping, spin coating, compression molding, and transfer molding in the encapsulating the chips on the substrate with the encapsulant.

6. The method of claim 1, wherein the resin is removed by a wet method or a plasma method in the removing the resin coated on the dicing lines.

* * * * *